United States Patent
Venkatesh et al.

(10) Patent No.: US 9,214,973 B1
(45) Date of Patent: Dec. 15, 2015

(54) TIME VARYING NOTCH FILTER

(71) Applicant: Marvell International Ltd., Hamilton (BM)

(72) Inventors: Swaroop Venkatesh, Dublin, CA (US); Vijay Ahirwar, Madhya Pradesh (IN)

(73) Assignee: Marvell International Ltd., Hamilton (BM)

( * ) Notice: Subject to any disclaimer, the term of this patent is extended or adjusted under 35 U.S.C. 154(b) by 95 days.

(21) Appl. No.: 13/941,390

(22) Filed: Jul. 12, 2013

Related U.S. Application Data (60) Provisional application No. 61/694,646, filed on Aug. 29, 2012.

(51) Int. Cl.
| | | |
|---|---|---|
| H04B 1/10 | (2006.01) |
| H04B 1/00 | (2006.01) |
| H03H 15/00 | (2006.01) |
| H04B 1/04 | (2006.01) |
| H04B 1/525 | (2015.01) |

(52) U.S. Cl.
CPC ........ *H04B 1/1036* (2013.01); *H03H 2015/007* (2013.01); *H04B 1/001* (2013.01); *H04B 1/0475* (2013.01); *H04B 1/1027* (2013.01); *H04B 1/525* (2013.01)

(58) Field of Classification Search
CPC ... H04B 15/02; H04B 15/06; H04B 2215/064
See application file for complete search history.

(56) References Cited

U.S. PATENT DOCUMENTS

| | | | | |
|---|---|---|---|---|
| 3,868,605 | A * | 2/1975 | Poole | 333/176 |
| 6,035,213 | A * | 3/2000 | Tokuda et al. | 455/553.1 |
| 6,798,604 | B1 * | 9/2004 | Kamimura et al. | 360/75 |
| 2002/0168951 | A1 * | 11/2002 | Paulus et al. | 455/130 |
| 2006/0008016 | A1 * | 1/2006 | Balakrishnan et al. | 375/260 |
| 2006/0093019 | A1 * | 5/2006 | Gaikwad et al. | 375/139 |
| 2008/0147392 | A1 * | 6/2008 | Shaffer et al. | 704/233 |
| 2008/0215321 | A1 * | 9/2008 | Droppo et al. | 704/235 |
| 2012/0307749 | A1 * | 12/2012 | Banister et al. | 370/329 |
| 2013/0051503 | A1 * | 2/2013 | Ly-Gagnon et al. | 375/343 |

* cited by examiner

*Primary Examiner* — Kenneth Lam
*Assistant Examiner* — Ross Varndell (57) ABSTRACT

The present disclosure includes systems and techniques relating to time-varying notch filter. In some implementations, an apparatus includes a time-variant notch filter and a controller. The time-variant notch filter includes a notch depth and a notch bandwidth. At least one of the notch depth or the notch bandwidth is based on a coefficient of the notch filter. The controller is configured to set at least one of the notch depth to a first depth or the notch bandwidth to a first bandwidth by setting a value of the coefficient to a first value during a ramp-up of the notch filter before a packet is received. The controller is also configured to set at least one of the notch depth to a second depth or the notch bandwidth to a second bandwidth by adjusting the value of the coefficient to a second value after the packet is received.

25 Claims, 5 Drawing Sheets

TIME VARYING NOTCH FILTER

CROSS REFERENCE TO RELATED APPLICATIONS

This application claims the benefit of the priority of U.S. Provisional Application Ser. No. 61/694,646, filed Aug. 29, 2012 and entitled "Dynamic or Time Varying Notch filter for Spur Suppression in Bluetooth Gen3", which is incorporated herein by reference in its entirety.

BACKGROUND

The present disclosure describes systems and techniques relating to time-varying notch filters.

Some signal processing circuits in a hardware system use integrated circuit (IC) dice of very small sizes, for example, 40 nano-meters (nm) and less. At such small dimensions of the component ICs, the signal processed by the circuit may suffer from greater interference due to other signals in the system. For example, a Bluetooth™ circuit in a hardware system with component ICs in the 40 nm range may be affected by various clock harmonics (also known as "spurs") due to other signals in the system, such as a reference clock signal or other clock signals present in the hardware system. In this context, a harmonic or a spur is a component frequency of a signal that is an integer multiple of the fundamental signal frequency, i.e. if the fundamental signal frequency is f, the harmonics have frequencies 2f, 3f, 4f, and so on.

The spurs may be produced at frequencies overlapping with the radio-frequency (RF) channels of the Bluetooth circuit discussed above, thereby affecting the sensitivity of the Bluetooth circuit. That is, due to the interference caused by the spurs in the Bluetooth RF channels, a Bluetooth signal packet received by the hardware system may not be decoded correctly by the Bluetooth circuit. For example, a clock signal external to the Bluetooth circuit may have a baseband frequency of 38.4 MHz. Accordingly, the $64^{th}$ harmonic of the external clock signal has a frequency of 2457.6 MHz, which falls within the frequency range of the Bluetooth circuit (2402-2480 MHz). If the operating frequency of the Bluetooth circuit is set close to 2457 MHz, then the sensitivity of the Bluetooth circuit would be severely degraded due to the spur of the external clock signal.

In some systems, spurs in a signal processing circuit may be removed by using a linear time-invariant (LTI) notch filter. In this context, a notch filter is a signal processing device (implemented either in hardware or as software processes) that allows an input signal to pass through the device unaltered at most frequencies, but attenuates an input signal within a specific, narrow frequency range (which may be referred to as the bandwidth of the notch filter) to very low levels (referred to as the depth of the notch filter). For example, a notch filter with a center frequency of 2457 MHz may be used in the Bluetooth circuit described above to reduce the effect of the spur at 2457.6 MHz.

The frequency response of notch filter is characterized by its bandwidth and depth. The depth of the notch determines the level of the input signal power that is removed and accordingly the extent to which the sensitivity of the signal circuit is achieved, with notch filters of greater depth removing more interference power and achieving greater sensitivity of the signal circuit. The sensitivity of the signal circuit may be negatively affected due to a spur. The degradation in sensitivity is dependent on the power of the interfering spur interferer. For a spur having a large power, the degradation may be large enough to cause sensitivity of the signal circuit to fall below one or more requirements set forth in the Bluetooth standard. Most of this degradation may be avoided by an LTI notch filter of proper bandwidth and depth (prior art).

The bandwidth of the notch determines the frequency range over which the signal is attenuated or cancelled. For example, a notch filter with a center frequency of 2457 MHz and a bandwidth of 6 MHz would attenuate signals in the frequency range of 2457 MHz±3 MHz, i.e., 2454-2460 MHz.

SUMMARY

The present disclosure includes systems and techniques relating to a time-varying notch filter, such as a linear time-varying (LTV) notch filter. According to an aspect of the described systems and techniques, an apparatus includes a time-variant notch filter and a controller.

The time-variant notch filter includes a notch depth, and a notch bandwidth centered on a notch frequency. At least one of the notch depth or the notch bandwidth is based on a coefficient of the notch filter.

The controller is configured to set at least one of the notch depth to a first depth or the notch bandwidth to a first bandwidth by setting a value of the coefficient to a first value during a ramp-up of the notch filter before a packet is received. The controller is also configured to set at least one of the notch depth to a second depth or the notch bandwidth to a second bandwidth by adjusting the value of the coefficient to a second value after the packet is received. The second depth is distinct from the first depth, and the second bandwidth is distinct from the first bandwidth.

Particular implementations may include one or more of the following features. The controller may comprise a processor and a non-transitory medium encoding instructions that are configured to instruct the processor to perform operations.

The controller may be configured to set the notch depth. The first depth may be greater than the second depth.

The controller may be configured to set the notch bandwidth. The first bandwidth may be greater than the second bandwidth.

The value of the coefficient may be varied in linear steps. The value of the coefficient at a time instant may be based on one or more of a center frequency of the notch filter, a sampling frequency of a signal that includes the packet, a constant controlling a rate of change of the notch bandwidth, and an initial value of the coefficient.

The apparatus may comprise a register, wherein the initial value of the coefficient may be pre-programmed into the register.

The value of the coefficient may be adjusted based on an estimated power of the packet, with the initial value of the coefficient set such that the notch filter is bypassed when the power of the packet is greater than a predetermined threshold. The apparatus may comprise an analog-to-digital converter (ADC). The estimated power of the packet may include power due to a harmonic of a clock signal. The harmonic may be determined using the ADC.

The packet may be a Bluetooth packet. The controller may be configured to measure a power associated with the packet. The controller also may be configured to determine whether a sync word portion of the packet is received based on the measured power associated with the packet. The controller may further be configured to set the notch depth to a third depth by adjusting the value of the coefficient to a third value in response to a determination that the sync word portion of the packet is received.

The third depth may be less than the first depth. The controller may be configured to measure the power associated with the packet by measuring a Received Signal Strength Indicator (RSSI) associated with the packet.

The notch filter may include a feedback section and a feedforward section, which may be configured to have a delay associated with the feedback section that is different from a delay associated with the feedforward section. The notch filter may be configured to process the packet using the feedforward section prior to processing the packet using the feedback section.

At least one of the first value or the second value may be stored in a lookup table associated with the notch filter. The controller may be configured to read at least one of the first value or the second value from the lookup table. The controller also may be configured to adjust the value of the coefficient based on reading at least one of the first value or the second value from the lookup table.

The controller may be configured to set the notch depth to one of a plurality of depths by adjusting the value of the coefficient to one of a plurality of values. The notch filter may include a plurality of notch depths and notch bandwidths centered on varying notch frequencies that are based on one or more coefficients of the notch filter. The controller may be configured to set one or more of the plurality of notch depths and notch bandwidths to respective depths and bandwidths by setting values of associated coefficients.

According to another aspect of the described systems and techniques, a method includes a filtering device receiving a communications signal. The filtering device determines one or more parameters of the communications signal. The filtering device selects a set of filter coefficient values based on the determined one or more parameters of the communications signal. The filter device adjusts one or more characteristics of the filtering device using the selected set of filter coefficient values to adjust a frequency response of the filtering device. The filtering device filters the communications signal using the frequency response of the filtering device determined by the adjusted characteristics of the filtering device. The filtering device updates the one or more characteristics of the filtering device, using the set of filter coefficient values, as a function of time.

Particular implementations may include one or more of the following features. Determining one or more parameters of the communications signal may comprise determining, by the filtering device, at least one of a power level of the communications signal, a packet type of a packet transmitted within the communications signal, or a frequency of an external signal harmonic that is causing interference with the communications signal.

The filtering device may be a notch filter. Configuring one or more characteristics of the filtering device may comprise configuring at least one of a notch depth or a notch bandwidth of the filtering device based on the determined parameters of the communications signal.

Configuring at least one of a notch depth or a notch bandwidth of the filtering device may comprise setting the notch depth and the notch bandwidth to first values at a first time instant, and updating values of the notch depth and the notch bandwidth in successive time instants following a linear curve. Updated values of the notch depth and the notch bandwidth may be based on the selected set of filter coefficient values.

The filtering device may determine, upon examining the received communications signal, whether end of packet header is reached. Based on determining that the end of the packet header is reached, the filtering device may measure a power level of the communications signal. The filtering device may compare the measured power level with a predetermined threshold value. Based on determining that the measured power level is greater than the predetermined threshold value, the filter coefficient values may be set to predetermined values.

The power level of the communications signal may include received signal strength indicator (RSSI).

The predetermined values of the filter coefficients may be lower than other filter coefficient values. The values of the notch depth and the notch bandwidth may be updated based on the predetermined values. The updated values of the notch depth and the notch bandwidth may be lower than previous values of the notch depth and the notch bandwidth.

The described systems and techniques can be implemented in electronic circuitry, computer hardware, firmware, software, or in combinations of them, such as the structural means disclosed in this specification and structural equivalents thereof. This can include at least one computer-readable medium embodying a program operable to cause one or more data processing apparatus (e.g., a signal processing device including a programmable processor) to perform operations described. Thus, program implementations can be realized from a disclosed method, system, or apparatus, and apparatus implementations can be realized from a disclosed system, computer-readable medium, or method. Similarly, method implementations can be realized from a disclosed system, computer-readable medium, or apparatus, and system implementations can be realized from a disclosed method, computer-readable medium, or apparatus.

For example, the disclosed embodiment(s) below can be implemented in various systems and apparatus, including, but not limited to, a special purpose data processing apparatus (e.g., a wireless access point, a remote environment monitor, a router, a switch, a computer system component, a medium access unit), a mobile data processing apparatus (e.g., a wireless client, a cellular telephone, a personal digital assistant (PDA), a mobile computer, a digital camera), a general purpose data processing apparatus (e.g., a minicomputer, a server, a mainframe, a supercomputer), or combinations of these.

The described systems and techniques can result in a LTV notch filter that has a short response and hence eliminates a spur in less time compared to a LTI notch filter, leading to lower bit errors in the processed packet. The characteristics of an LTI notch filter are static, which may lead to a tradeoff between performance in the presence of spur (i.e., circuit sensitivity achievable using the notch filter) and the filter characteristics of notch depth and notch bandwidth. A low bandwidth, deep notch LTI notch filter, while providing greater circuit sensitivity, may have a long impulse response in the order of several milliseconds that causes a "smearing effect" on the data signal, i.e., notch response affects the data signal due to inter-symbol interference, leading to bit errors in the processed packet. Furthermore, actual attenuation of the spur takes time in proportion of the static impulse response length. This means that spur cancellation may take long time for narrow bandwidth notch filter which may cause bit errors in data portion immediately after the application of the notch filter when the spur is not sufficiently attenuated. On the other hand, a high bandwidth LTI, low depth notch filter may attenuate data portions of the signal in addition to the spur, thereby causing poor sensitivity, even if it does not cause significant inter-symbol interference and may have faster attenuation of spur.

For these reasons, it may be useful to design a notch filter in which spurs may be attenuated without degrading the actual signal data. This may be achieved by a linear time-varying (LTV) notch filter designed using the systems and techniques described herein, which is a notch filter with characteristics that may be varied with time.

As described herein, in one implementation the LTV notch filter is designed such that initially the filter has high bandwidth and deep notch, which removes the spur during initial ramp-up of the signal processing circuit where the LTV notch filter is used, before the signal packet has arrived. At a later stage, the LTV notch filter is modified with a low bandwidth and low depth such that it does not attenuate the signal data.

The LTV notch filter designed using the systems and techniques described herein may attenuate data portions of the signal to a considerably lesser extent compared to a LTI notch filter, thereby leading to improved sensitivity for the signal processing circuit in which the LTV notch filter is used. For example, upon applying such LTV notch filters to the Bluetooth circuit described herein, the spurs may be attenuated across the Bluetooth channels such that uniform sensitivity is achieved across all the Bluetooth channels, resulting in improved performance across all the channels.

Details of one or more implementations are set forth in the accompanying drawings and the description below. Other features, objects and advantages may be apparent from the description and drawings, and from the claims.

DETAILED DESCRIPTION

The systems and techniques described herein can be implemented as one or more devices, such as one or more integrated circuit (IC) devices, in signal processing circuits (e.g., a wireless communication device, a digital power controller device, an audio amplifier device). For example, the systems and techniques disclosed can be implemented in a Bluetooth transceiver circuit (e.g., a Bluetooth chipset) suitable for use in a wireless communication system.

Figure 1:
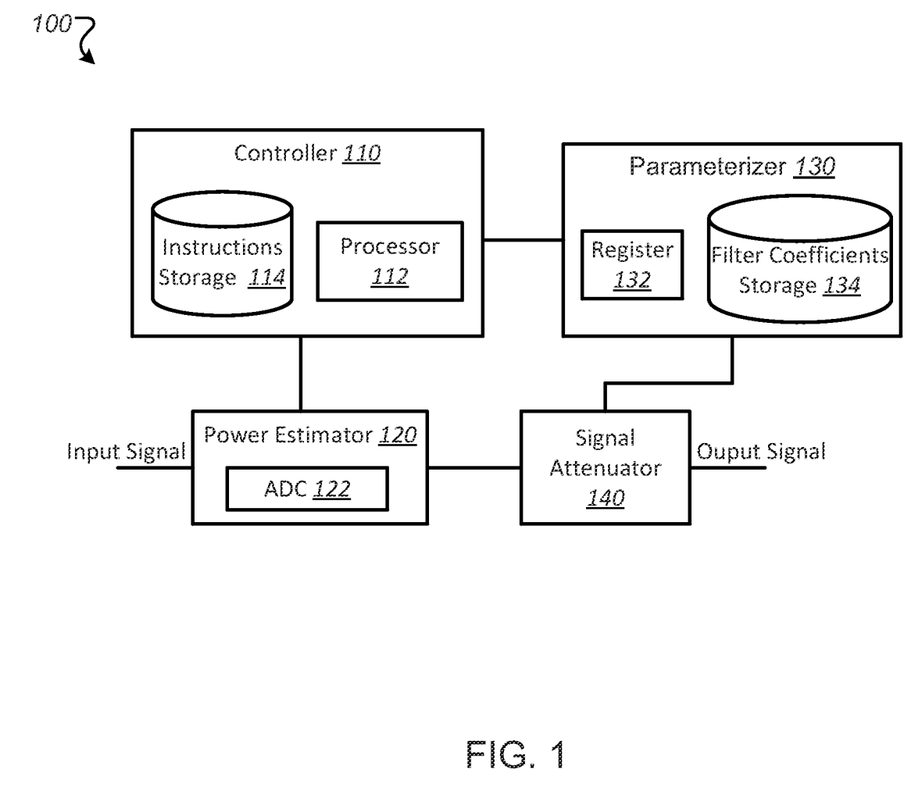
FIG. 1 is a block diagram showing an example of a time-varying notch filter.

FIG. 1 is a block diagram showing an example of a time-varying notch filter 100. The notch filter 100 may be implemented in a signal processing circuit, such as a Bluetooth circuit, to reduce or eliminate the interference caused due to spurs on the data signal. The notch filter 100 is designed such that the characteristics of the notch filter may be varied with time by varying the values of one or more filter coefficients that control the characteristics of the notch filter. The variations in the characteristics of the notch filter may be based on measuring the power level of the input signal. In some implementations and as described in the following sections, the notch filter 100 is a linear time-varying (LTV) notch filter, in which the characteristics of the notch filter vary linearly as a function of time. However, in other implementations, the notch filter 100 may be a non-linear time-varying notch filter, in which the characteristics of the notch filter vary non-linearly with time. In addition, in some implementations, the notch filter 100 is a digital filter, while in other implementations the notch filter 100 may be an analog notch filter.

As shown in FIG. 1, the notch filter 100 includes one or more component modules, such as a controller 110, a power estimator 120, a parameterizer 130 and a signal attenuator 140. The controller 110 may include a processor 112 and instructions storage 114. The power estimator 120 may include an analog-to-digital converter (ADC) 122, while the parameterizer 130 may include a register 132 and filter coefficients storage 134.

As described in greater detail in the description below, the controller 110 is configured to determine the values of the filter coefficients of the notch filter 100, which control the bandwidth and depth characteristics of the notch filter and thereby control the frequency response of the notch filter. The processor 112 performs the various operations executed by the controller 110, following instructions that are stored in the instructions storage 114.

The processor 112 may be a digital processing element, or it may be a general purpose microprocessor. The instructions storage 114 may be any suitable storage element, such as on-chip memory embedded in the signal processing circuit using the notch filter 100. Alternatively, the instructions storage 114 may be non-volatile memory, such as flash memory, or any other suitable storage medium that is configured to store data in a persistent manner.

The instructions stored in the instructions storage 114, which may be programmed at the time of implementing the notch filter 100, may be configured to cause the processor 112 to compute and update the filter coefficients from time to time based on the measure power level of the input signal.

The power estimator 120 is configured to measure the power level of the input signal that is received by the signal processing circuit in which the notch filter 100 is used. The input signal is received by the notch filter 100 at an input of the power estimator 120.

By measuring the power level of the input signal, the power of the interfering spur that is to be cancelled by the notch filter may be determined. The ADC 122, which is included in the power estimator 120 in some implementations of the notch filter 100, is used to determine the frequency of the spur.

In some implementations, the power estimator 120 and the ADC 122 measure the power level and center frequency respectively of the spur based on instructions received from the processor 112. For example, each measurement may be triggered by a command from the processor 112.

The power of the spur measured by the power estimator 120 and the spur frequency measured by the ADC 122 are fed back to the processor 112. Based on the measured values of the spur power and the spur frequency, the processor 112 sends commands to the parameterizer 130 for configuring the coefficients of the notch filter 100.

The parameterizer 130 varies the filter coefficients dynamically as a function of time as given by equation (1):

$$a[n]=a_0+\alpha n$$

$$b[n]=-2(1-a[n])\cos\omega \qquad (1)$$

As shown in equation (1), a and b control the filter coefficients that may vary linearly as functions of the time index n in discrete steps. The value of coefficient a parameterizes the notch depth and the notch bandwidth. The value of coefficient b is a function of coefficient a and the center frequency $\omega$ of the notch filter. $a_0$ is the initial value of the coefficient a, while $\alpha$ is a constant in case of linear coefficient variation over time, indicating that the value of coefficient a changes linearly with time. In some implementations a[n] may be a non-linearly varying parameter over time. Some implementations may have a as a continuously varying signal instead of varying in discrete steps.

In some implementations, the center frequency ω also may be a variable parameter, which will result in change in the center frequency and the range of attenuated frequencies. Such an implementation may be used in case the spur frequency is varying over time.

The difference equation of the notch filter as a function of the filter coefficients a and b and the time index n is shown by equation (2):

$$y[n]=(1-a[n])x[n]+b[n]x[n-1]+(1-a[n])x[n-2]-b[n]y[n-1]-(1-2a[n])y[n-2] \quad (2)$$

x[n] indicates the input signal at time index n, while y[n] indicates the filtered output signal at time index n.

As indicated by equations (1) and (2), a small value of coefficient a results in a lesser notch depth and a small notch bandwidth that yields a longer impulse response, i.e., the frequency response of the notch filter takes longer to decay. On the other hand, a large value of coefficient a leads to a greater notch depth and large notch bandwidth, but a shorter impulse response.

The value of $a_0$ determines the initial frequency response of the notch filter 100. A large value of $a_0$ results in a notch filter having a deep initial notch, which leads to more spur power being cancelled, but a large initial bandwidth that results in more of the useful portions of the signal being attenuated, though the impulse response is shorter. On the other hand, a small value of $a_0$ results in a notch filter having an initial notch of limited depth, which leads to less spur cancellation, but a narrow initial bandwidth that removes less of the useful portions of the signal. However, the impulse response is longer, which causes more interference with the signal.

The value of the constant α dictates the rate of change in the values of the coefficients a and b, and therefore the frequency response of the notch filter 100. A larger value of α leads to the "slope" of equation (1) being steeper, i.e., the values of the coefficients a and b change more rapidly with the time index, compared to a case with a smaller value of α. In some implementations, α may be set to a value that limits the rate of change in the coefficient values below certain thresholds, to prevent instability in the frequency response of the notch filter that may arise otherwise.

In some implementations, α is a positive quantity and therefore the value of coefficient a increases linearly with time. In other implementations, α is a negative quantity and therefore the value of coefficient a decreases linearly with time. Whether α is a positive or a negative constant may depend on the dynamic frequency response of the notch filter that is desired, which may be based on the type of spur cancellation that is needed.

When α is a positive constant, then the value of coefficient a increases with time, and therefore the notch bandwidth and the notch depth increases in successive time indices. Using this design, of the notch filter 100 cancels progressively greater amounts of the signal magnitude with time, but also removes greater amounts of the useful portions of the signal due to the wider bandwidth. Such a design of the notch filter 100 may be useful in signal processing circuits where the spur power increases with time.

On the other hand, when α is a negative constant, the value of coefficient a decreases with time, leading to narrower notch bandwidth and shallower notch depth in successive time indices. A notch filter 100 designed with a negative value of α cancels progressively smaller amounts of the signal with time, but attenuates lesser amounts of the useful signal. However, the notch filter also may have progressively longer impulse responses, thereby causing greater inter-symbol interference. Such a design of the notch filter 100 may be useful in signal processing circuits where the spur power decreases with time.

In some implementations of the notch filter 100 with negative value of α, since coefficient a decreases linearly with the time index n, the value of coefficient a may become 0 or negative, which may make the notch filter 100 unstable. To avoid such situations, the parameterizer 130 can set the lower bound of the coefficient a to a_cap, which is a positive value.

In some implementations the notch filter 100 may be a digital filter, in which the coefficients a and b may be represented by a fixed number of bits $N_b$. In such cases, the range of the coefficients a and b depend on the number of bits $N_b$ used by the notch filter 100 to represent the values of the coefficients, with a larger number of bits yielding a greater range. For example, in some implementations $N_b$ may be 16, while in some other implementations $N_b$ may be set to 20 for increased range.

Equations (1) and (2) allow a design of the notch filter 100 that is based on performance requirements. For example, in one implementation, the requirement may be to cancel the spur in 100 microseconds, which translates to 1600 samples at 16 MHz frequency. In this case, coefficient a may be varied from $8000/2^{N_b}$ to $8/2^{N_b}$ over 1600 samples. Then the rate may be set to approximately 8000/1600=5 LSBs per sample, which leads to the value of the initial coefficient $a_0$ being $8000/2^{N_b}$, with $α=-5/2^{N_b}$. In this example, the value of a_cap is set to $8/2^{N_b}$, which will be reached at the $1600^{th}$ sample, i.e., after 100 microseconds.

The parameterizer 130 may store the initial coefficient value $a_0$ in the register 132. The size of the register 132 may be based on the number of bits used to represent the values of the coefficients a and b. Accordingly, register 132 may be a 16-bit register when $N_b$=16. In some implementations, the register 132 may be a programmable register such that the initial coefficient value $a_0$ that is stored in the register 132 may be programmed by a user and updated as needed.

Other values of the filter coefficients a and b, and α may be stored in the filter coefficients storage 134, which may be on-chip memory embedded in the signal processing circuit using the notch filter 100. Alternatively, the instructions storage 114 may be non-volatile memory, such as flash memory, or any other suitable storage medium that is configured to store data in a persistent manner.

In some implementations, lookup tables for values of the coefficients a and b may be stored in the filter coefficients storage 134. Different RF channels that are processed by the signal processing circuit may use different sets of values of the coefficients a and b based on the spur frequency and spur power corresponding to the RF channel. For a particular RF channel, a single set of values of the coefficients a and b may be used for a bounded range of the spur power, yielding a particular frequency response of the notch filter 100 for a given power range. However, more than one set of values of the coefficients a and b may be used for wide variability in the spur power. For example, for a particular center frequency (for example, 1.5 MHz) channel and an estimated receive signal power level less than −85 dBm, one set of coefficients a and b may be used. When the estimated receive signal power level is greater than −85 dBm, a different set of coefficients a and b may be used, leading to a different frequency response of the notch filter 100, i.e., a different design of the notch filter. For these reasons, the parameterizer 130 may store different lookup tables in the filter coefficients storage 134, with each lookup table being associated with a different set of values of coefficients a and b.

In some implementations, the parameterizer 130 may store different lookup tables in the filter coefficients storage 134 that are based on the data types carried by the input signal to the signal processing circuit. For example, if the notch filter 100 is used in a Bluetooth circuit, the notch filter may be configured using one set of values of the coefficients a and b for basic data rate (BDR), Bluetooth version 2 enhanced data rate (EDR2) and Bluetooth version 3 enhanced data rate (EDR3) Bluetooth packets. However, for Bluetooth low energy (BLE), a different frequency response of the notch filter may be used, which is based on a different set of values of the coefficients a and b. In some implementations, one or more different sets of coefficients can be used for one or more different technologies residing on the same System on Chip (SoC).

Although the controller 110 and the parameterizer 130 are shown as separate modules in the example notch filter 100, in some implementations the two may be integrated in one module. In such implementations, the controller 110 may include the register 132 and the filter coefficients storage 134, and the controller 110 may perform the functions that are described as being performed by the parameterizer 130. For example, the processor 112 may be configured to read the initial coefficient values from the register 132; determine the values of the filter coefficients and the filter characteristics based on equations (1) and (2) above; store the sets of values in the filter coefficients storage 134; and perform any other operations that are described herein as being performed by the parameterizer 130.

The signal attenuator 140 performs the actual spur cancellation of the input signal, which is received at the signal attenuator after passing through the power estimator 120. The signal attenuator 140 receives the values of the coefficients a and b values from the parameterizer 130 and adjusts the depth and bandwidth of the notch filter 100 accordingly to set the frequency response desired for the estimated spur power and spur frequency. The spur is then attenuated, i.e., removed, from the input signal without affecting the data portions of the signal. The output of the signal attenuator 140 is the output of the notch filter 100, which is the processed signal without the spur, but retaining the data portions.

In the manner described above, the coefficients of the notch filter may be dynamically adjusted based on the spur power and spur frequency, such that the notch filter 100 may cancel the spur without attenuating useful signal data, or without causing inter-symbol interference. As shown by equations (1) and (2), the coefficients, and therefore the characteristics of the notch filter, may be varied linearly as a function of time, yielding the designation of the notch filter 100 as a linear time-variant (LTV) notch filter.

In some implementations, each of the component modules described above may be implemented in hardware, for example using IC dice embedded in the signal processing device in which the notch filter 100 is used. In some implementations, the component modules may be implemented as a combination of hardware and computer code (e.g., software or firmware), where the computer code is stored in a memory medium (for example, embedded RAM or non-volatile flash memory) and executed by one or more processors (for example, processor 112).

In some implementations, the notch filer is configured to handle multiple simultaneous spurs that are associated with different center frequencies. In such implementations, the notch filter may be configured with multiple value sets of the filter coefficients (for example, a and b), where different values of the filter coefficients correspond to different spurs.

Figure 2:
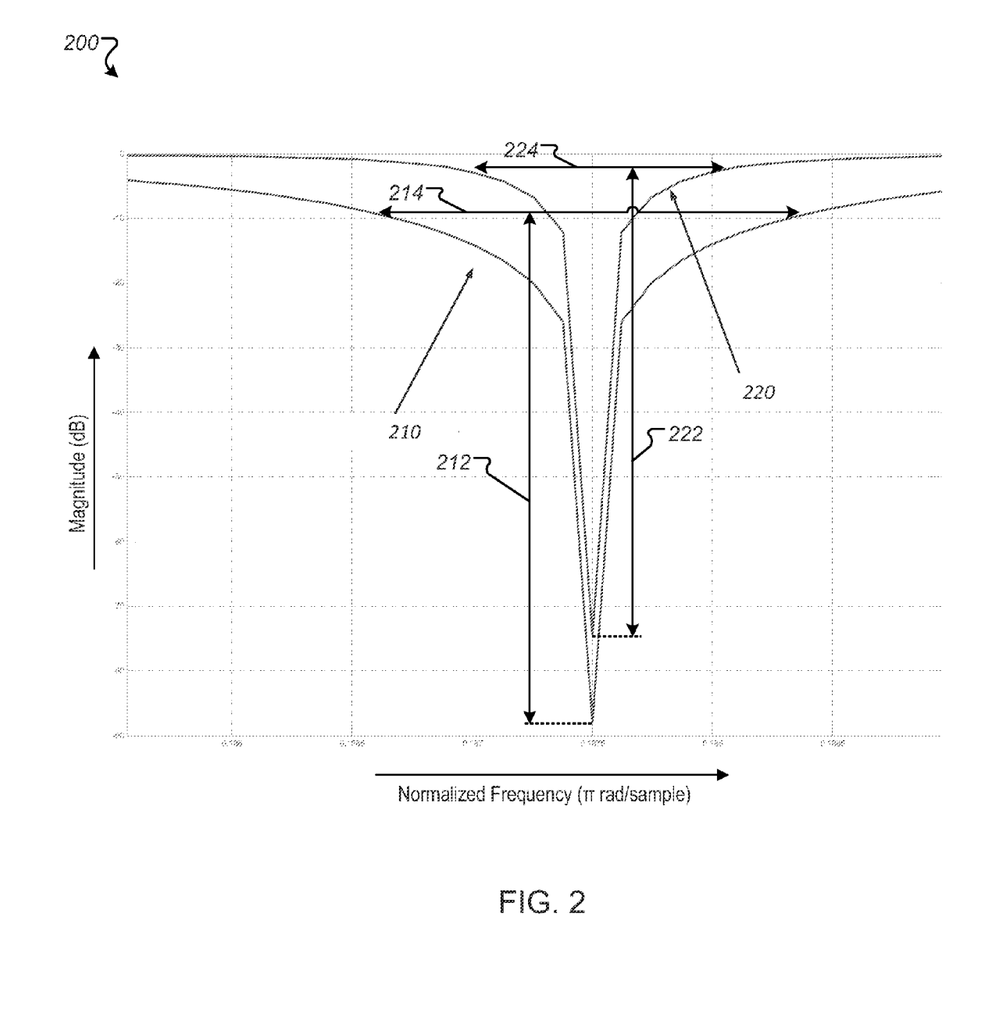
FIG. 2 shows a graph providing an example of the variation in frequency response of a time-varying notch filter as a function of time.

FIG. 2 shows a graph 200 providing an example of the variation in frequency response of a time-varying notch filter as a function of time. The plots shown in the graph 200 may correspond to the frequency response of the LTV notch filter 100. Accordingly, in the following description, the graph 200 is described with respect to the notch filter 100. However, the graph 200 also may be applicable to other notch filters, including non-linear time-varying notch filters.

As shown in FIG. 2, the graph 200 plots the magnitude response of the notch filter as curves 210 and 220. The x-axis of the graph 200 shows the normalized frequency of the signal in units of $\pi$ rad/sample (where "rad" indicates radians) while the y-axis of the graph 200 shows the magnitude of the notch filter response in decibels (dB).

Curve 210 has a notch depth 212 and notch bandwidth 214, while curve 220 has a notch depth 222 and notch bandwidth 224. For each curve, the notch bandwidth refers to the frequency range over which the attenuation in signal power level is same as or greater than a predetermined threshold. The notch depth refers to the attenuation in signal power level between the predetermined threshold and a maximum signal power level attenuation for a particular curve. In some implementations, the predetermined threshold is based on a certain percentage of the highest signal power level for a curve. For example, the predetermined threshold may be set at 20% of the highest signal power level. In this case, the notch bandwidth for a signal may be the frequency range over which the signal power level falls by more than 20% of the highest signal power level. The maximum attenuation of the signal may be at 90% of the highest signal power level. Therefore, the notch depth for the signal may be the power level between 20% and 90% of the highest signal power level. Although the curves in FIG. 2 show two notch depths and corresponding notch bandwidths, the notch filter is configured for adjusting the filter characteristics to multiple notch depths and notch bandwidths.

Curve 210 illustrates the initial frequency response of the notch filter, while curve 220 is the response of the notch filter at a later point in time. As shown, the initial notch depth 212 is greater than the later notch depth 222, while the initial notch bandwidth 214 is wider than the later notch bandwidth 224. This indicates that as time progresses, the coefficients of the notch filter are dynamically adjusted such that both the notch depth and the notch bandwidth are reduced. This may be achieved using a negative value of the constant a, as discussed previously.

By varying the characteristics of the notch filter as shown by the graph 200, the structure of the input signal may be preserved as much as possible while tailoring the response of the notch filter according to the structure of the data packet that is transmitted in the input signal. The graph 200 indicates that the notch filter has a very fast response initially, i.e., a deeper notch 212 and wider bandwidth 214 as shown by curve 210, during the noise portion of the signal and when the preamble of the packet is received, which is more robust compared to the data portion of the packet. Using this frequency response of the notch filter, a greater portion of the spur may be removed without negatively affecting the data.

Subsequently, as the data portion of the packet is received in the signal, the frequency response of the notch filter is slowed by adjusting the filter characteristics to a shallower notch depth 222 and a narrower notch bandwidth 224. The adjusted frequency response of the notch filter attenuates the signal power to a lesser extent, which may be beneficial as the data portion of the packet may have greater sensitivity to power adaptation, compared to the preamble of the packet. In addition, since the adjusted frequency response affects a smaller frequency spectrum, it may affect less of the signal bandwidth that includes data. Consequently, less of the useful data portion of the packet may be removed by the notch filter.

Figure 3:
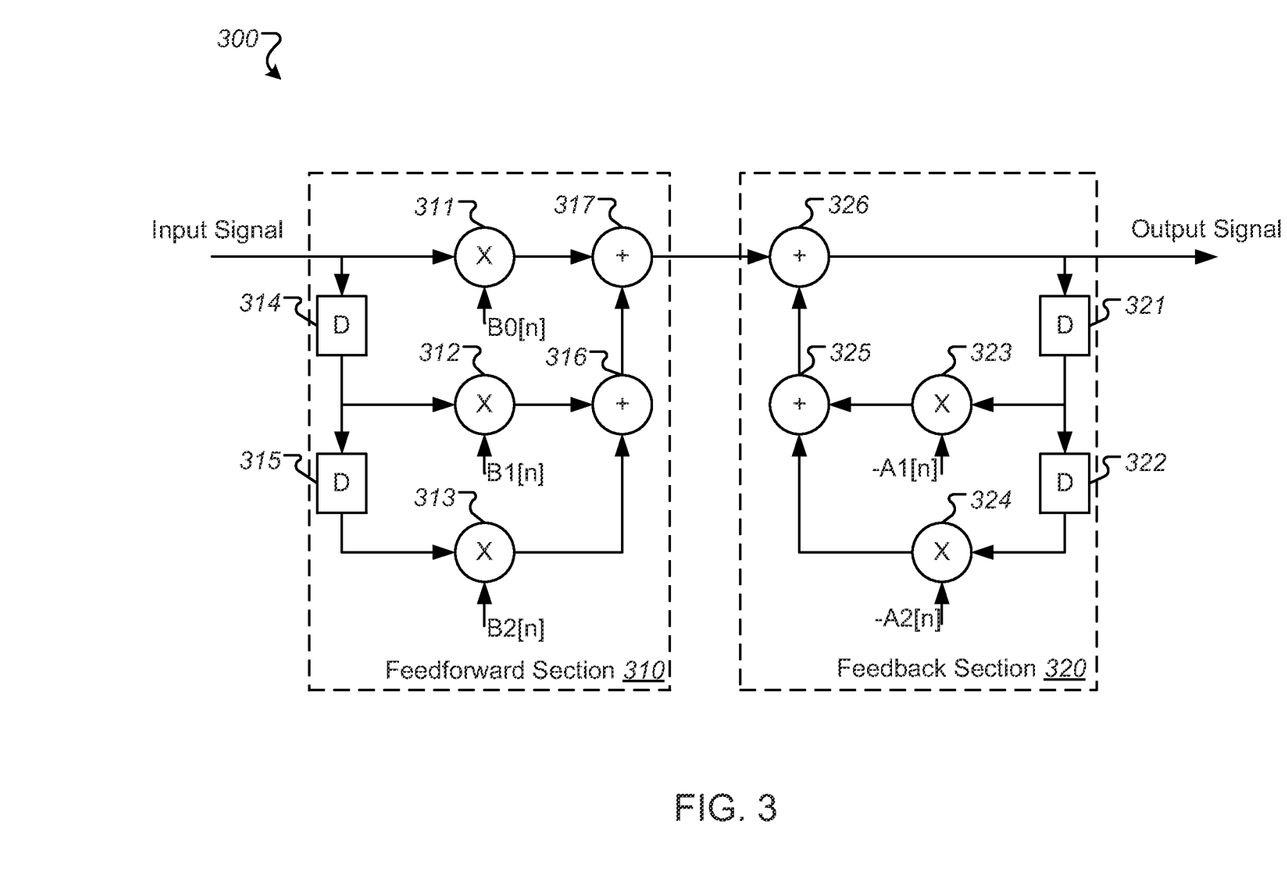
FIG. 3 is a block diagram showing an implementation example of a linear time-varying (LTV) notch filter.

FIG. 3 is a block diagram showing an implementation example of a linear time-varying (LTV) notch filter 300. The notch filter 300 is designed such that the bandwidth and the depth of the notch filter may be updated dynamically by varying, e.g., linearly in discrete time steps, the values of one or more filter coefficients that control the characteristics of the notch filter. The notch filter 300 may be an example of the notch filter 100. Accordingly, in the following description, the notch filter 300 is described with respect to the notch filter 100. However, the notch filter 300 also may be applicable to other time-varying notch filters.

The notch filter 300 includes a feedforward section 310 and a feedback section 320. The feedforward section 310 includes mixers 311, 312 and 313; delay circuits 314 and 315; and adders 316 and 317. The feedback section 320 includes delay circuits 321 and 322; mixers 323 and 324; and adders 325 and 326.

As shown in FIG. 3, the notch filter 300 is implemented with feedforward section 310 and the feedback section 320 separated from each other, since the delays associated with the two sections may be different. In some implementations, positioning of the feedforward section and the feedback section in a manner that is different from the implementations of the notch filter 300 may result in a less useful LTV notch filter. For example, in some cases a LTV notch filter that is implemented using a Direct Form structure (such as in a LTI filter) may be of reduced utility compared to the notch filter 300.

The coefficients associated with the feedback section 320 and the feedforward section 310 (for example, A and B respectively) are based on the filter coefficients a and b of the notch filter 300. The values of the coefficients a and b are updated by varying coefficient a linearly in discrete time steps, following equation (1). The notch filter 300 monitors what the values of the coefficients a and b should be for each clock cycle, i.e., each time step.

As described below, in some implementations, the notch filter 300 is designed by expanding the precision of the different delay paths that are used to process the input signal. This may be useful in reducing the number of fixed point approximations used to remove the spur from the input signal, i.e., less time taken to filter out the effects of the spur from the signal, leading to improved filter performance.

In more detail, equations (1) and (2) may be equivalently written as:

$$y[n]=B_0[n]x[n]+B_1[n]x[n-1]+B_2[n]x[n-2]-A_1[n]y[n-1]-A_2[n]y[n-2]$$

$$a[n]=a_0+an$$

$$b[n]=-2(1-a[n])\cos\omega \quad (3)$$

$$B_0[n]=(1-a[n])=B_2[n]$$

$$B_1[n]=b[n]=A_1[n]$$

$$A_2[n]=(1-2a[n]) \quad (4)$$

The input signal is processed by the feedforward section 310 first. As shown by equations (3) and (4), when the input signal is received by feedforward section 310, initially the value $B_0$ is mixed with the signal using mixer 311. The input signal is also delayed by in incremental time steps using delay circuits 314 and 315. The delayed signal is mixed with values $B_1$ and $B_2$ in different time steps using mixers 312 and 313 respectively. The delayed and non-delayed signal components are added together using adders 316 and 317, and the resulting signal is fed to the feedback section 320.

In the feedback section 320, the signal received from the feedforward section is delayed in incremental time steps using delay circuits 321 and 322. The delayed signal is mixed with values $A_1$ and $A_2$ of the coefficient a in different time steps using mixers 323 and 324 respectively. As shown by equation (3), $A_1$ and $A_2$ are used to scale down the signal power level, which is indicated by the negative signs in front of $A_1$ and $A_2$ in FIG. 3.

The delayed and non-delayed signal components are added together using adders 325 and 326, and the resulting signal is processed and forwarded as the output signal.

Figure 4:
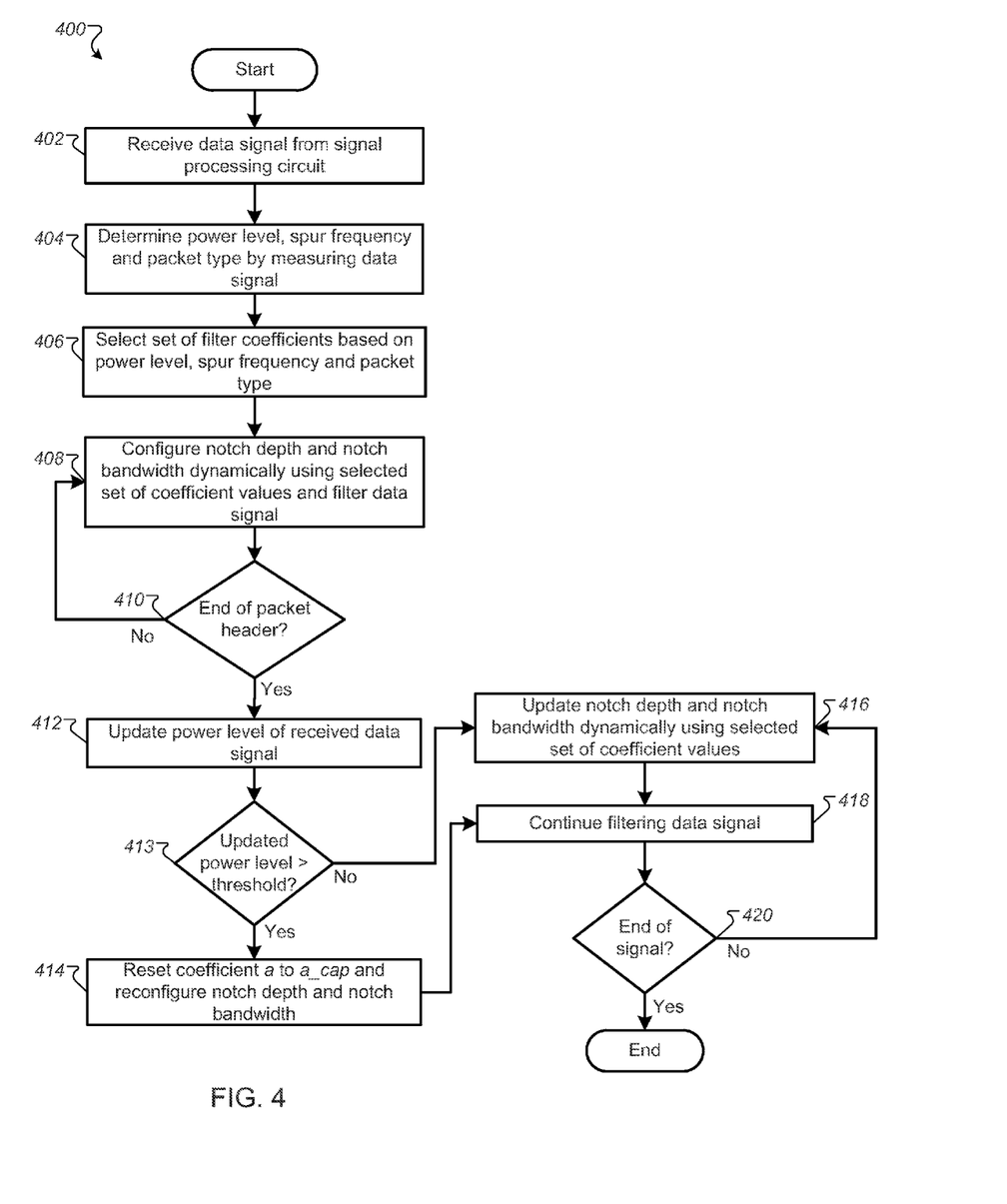
FIG. 4 is a flowchart showing an example of a process for filtering a data signal using a time-varying notch filter.

FIG. 4 is a flowchart showing an example of a process 400 for filtering a data signal using a time-varying notch filter. The process 400 may be performed by the linear time-varying (LTV) notch filter, for example by the notch filter 100. Accordingly, the following section describes the process 400 as being performed by the components of the notch filter 100. However, in other implementations, the process 400 may be performed by other devices, circuits, or systems, including non-linear time-varying notch filters.

At 402 in the process 400, a data signal is received (e.g., by the power estimator 120) from the signal processing circuit in which the notch filter 100 is used. The data signal may be a communications signal that includes a spur causing interference with the useful portions of the signal, and a preamble of a packet transmitted as part of the signal.

The power level, spur frequency and packet type are determined by measuring the data signal at 404. For example, the power estimator 120 measures the input signal. The signal power level is measured (e.g., using the ADC 122) to estimate the spur power. In some implementations, the ADC may measure the received signal strength indicator (RSSI) as the signal power level. The ADC 122 also may determine the spur frequency from the signal measurement.

The power estimator 120 may further determine the packet type from the signal measurement, e.g., by examining the preamble of the packet that is received as part of the initial portion of the data signal. If the input signal is a Bluetooth signal, the preamble may indicate that the packet type is one of BDR, EDR2, EDR3, BLE, or any other supported packet types.

At 406, the notch filter selects a set of filter coefficients based on the power level, spur frequency and packet type. For example, the controller 110 receives the measured signal power level, spur frequency and packet type from the power estimator 120. In some implementations, the controller 110 determines a set of values for the filter coefficients a and b based on the received measurements. In some implementations, the controller 110 forwards the measurements to the parameterizer 130, which determines the set of values for the filter coefficients a and b based on the received measurements.

As described previously, the notch filter 100 may store multiple sets (e.g., in the filter coefficients storage 134) of values of the coefficients a and b, where each set is associated with a different combination of the power level, spur frequency and packet type. Upon receiving the measurements from the power estimator 120, the controller 110, or the parameterizer 130, or both, identify a stored combination of the power level, spur frequency and packet type that most closely matches the values obtained from the measurements. The notch filter selects the set of coefficient values that is associated with the identified combination.

The notch depth and notch bandwidth are dynamically configured using the selected set of coefficient values and the data signal is filtered at 408. For example, the parameterizer 130 reads the selected set of values for the coefficients a and b from the storage 134 and configures the notch depth and notch bandwidth using the coefficient values from the set, e.g., following equations (1) and (2). In some implementations, the sets of coefficient values may be stored as table form, e.g., as a lookup table, with the parameterizer 130 reading the coefficient values from the lookup table.

The data signal is filtered by the notch filter (e.g., using the attenuator 140) based on the frequency response of the filter, which is determined by the configured notch depth and the notch bandwidth.

As the coefficient values vary linearly in discrete time steps, e.g., as shown by equation (1), the parameterizer 130 updates the notch depth and notch bandwidth in discrete time steps, e.g., every clock cycle, using the values of the coefficients a and b corresponding to the particular time step. Therefore, the frequency response of the notch filter varies linearly with time in discrete steps. Consequently the magnitude of signal power attenuated, and the frequency range over which the signal power is attenuated, vary linearly with time.

As the data signal is filtered, the notch filter checks whether the end of packet header is detected in the received signal at 410. For example, if the signal is a Bluetooth signal, the controller 110 determines, based on the signal measurement using the power estimator 120, whether bits of the Bluetooth packet corresponding to sync word correction are received, which indicates the trailing portion of the preamble (or the beginning of the data portion) of the Bluetooth packet.

If the end of packet header is not detected, the notch filter continues to update the filter coefficients and filter the data signal at 408. When the end of packet header is detected, the notch filter triggers an update of the power level of the received data signal at 412. For example, the controller triggers the power estimator 120 to measure the input signal and update the measured power level. In some implementations, the power estimator 120 may measure and update the RSSI of the input signal.

The notch filter determines whether the updated power level is greater than a threshold at 413. For example, the controller 110 compares the updated power level (e.g., the updated RSSI) measured by the power estimator 120 to a threshold power level and determines which one is greater. In some implementations, the threshold power level may be a pre-computed value that is stored in the notch filter, e.g., in the instructions storage 114 or the filter coefficients storage 134.

If the updated power level is determined to be greater than the threshold, then the notch filter resets the filter coefficient a to a_cap and reconfigures notch depth and notch bandwidth at 414. For example, upon determining that the updated power level of the signal is greater than the pre-computed threshold, the controller 110 resets the value of coefficient a to value a_cap, which is a pre-computed value of the coefficient stored in the notch filter, e.g., in the filter coefficients storage 134. In some implementations, the controller 110 instructs the parameterizer 130 to reset the value of coefficient a to a_cap.

In some implementations, the value of a_cap may be less than the most recently set value of coefficient a. For example, a_cap may be lowermost value of coefficient a. In some implementations, the value of a_cap may be different for different sets of values of the coefficients a and b, while in other implementations, a_cap may have one universally applicable value.

Resetting the value of coefficient a to a_cap may be performed to reduce (e.g., when value of a_cap is lower than other values of coefficient a) the magnitude of signal attenuation by the attenuator 140 as the header of the packet in the received signal is ending, i.e., the data portion of the packet is about to be received in the signal. This may be useful since the data portion of the packet may be more sensitive to signal attenuation compared to the header portion, as discussed previously. For example, if the signal is a Bluetooth signal with the packet type being EDR3, deep attenuation of the data portion of the signal may result in the signal processing circuit being unable to recover the data from the signal.

By lowering the value of coefficient a to a_cap, the notch depth and the notch bandwidth are reduced. Consequently, the magnitude of signal power level attenuation is lowered, leaving more of the power level associated with the data portion of the signal intact and thereby recoverable by later stages of the signal processing circuit. The frequency range over which the signal power is attenuated is also narrower, such that the probability of attenuating signal frequency that includes useful data is reduced.

By adjusting the value of coefficient a (and therefore, also coefficient b, since the latter depends on the value of the former) in this manner, the notch filter may decide whether or not to attenuate the received signal based on the power level of the received signal. For example, if the RSSI of the data signal is strong such that the spur has little or no effect on the signal, then filtering of the signal may be bypassed by setting the value of coefficient a to a_cap. In this case, a_cap may be preset to a value that minimizes the attenuation performed by the notch filter.

If the controller determines that the updated power level of the signal is not greater than the pre-computed threshold, then the notch depth and notch bandwidth continue to be updated dynamically using the selected set of coefficient values at 416, as in 408. In either case, following resetting the value of coefficient a to a_cap or updating the notch characteristics using the selected set of coefficient values, the notch filter continues to filter the data signal at 418. For example, the attenuator 140 continues to attenuate the input signal based on the configured notch depth and notch bandwidth, and forwards the filtered signal to the next stage in the signal processing circuit.

As the data signal is received and filtered, the notch filter checks whether the end of the signal is received at 420. For example, based on the measurement of the input signal by the power estimator 120, the controller 110 determines whether the end of the signal is reached. In some implementations, such a determination may be made if the power level of the input signal falls below a certain threshold, e.g., close to 0 dB.

The notch filter continues filtering the data signal, as in 416 and 418, if the end of the signal is not reached. When the notch filter determines that the end of the signal is reached, then the filtering operation is terminated and the process ends.

Figure 5:
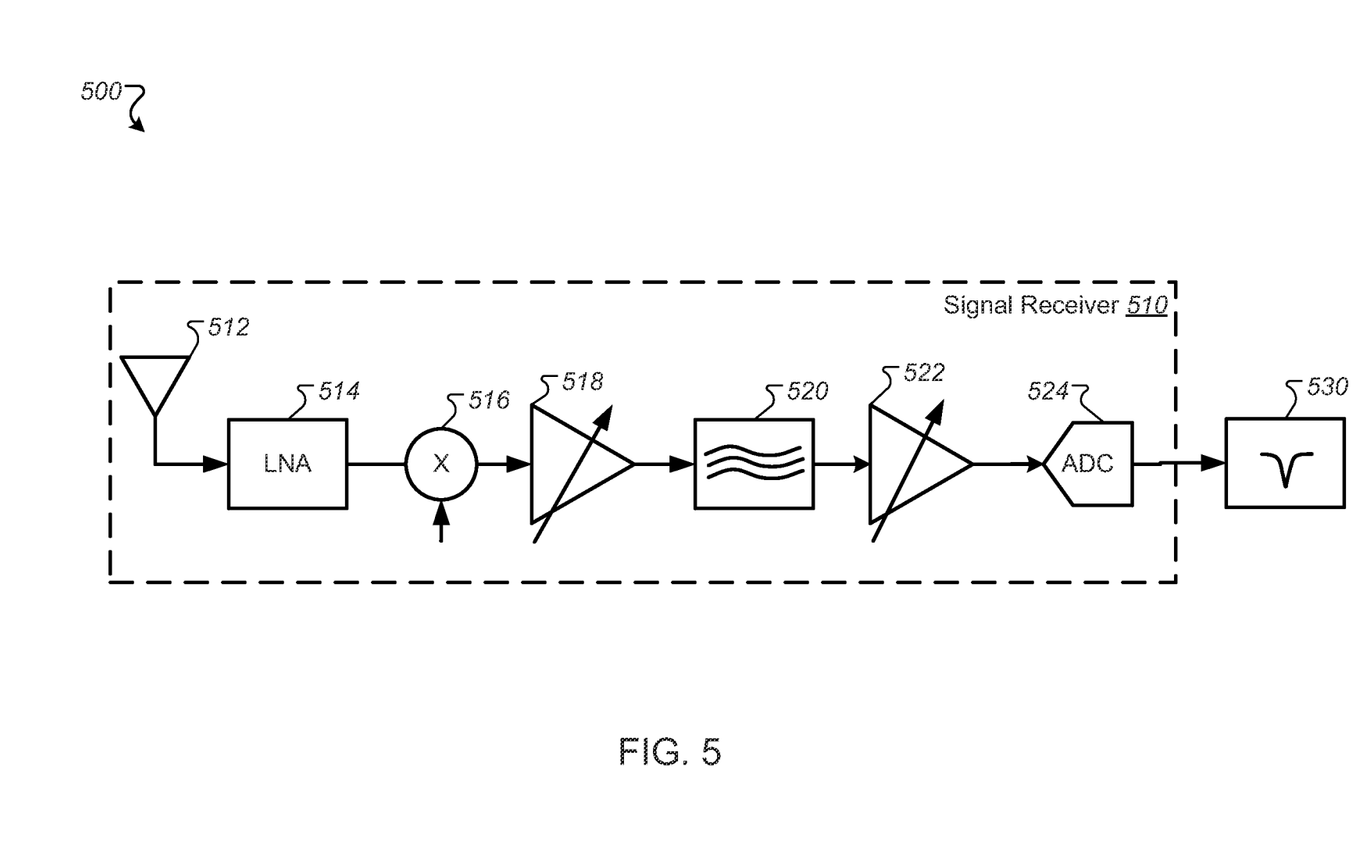
FIG. 5 shows an example of a signal processing circuit that uses a time-varying notch filter for spur cancellation.

FIG. 5 shows an example of a signal processing circuit 500 that uses a time-variant notch filter for spur cancellation. The signal processing circuit 500 may be part of a system such as a wireless communication device, a digital power controller device or an audio amplifier device. In some implementations, the signal processing circuit may be a Bluetooth device.

As shown in FIG. 5, the signal processing circuit 500 includes a signal receiver 510 and a LTV notch filter 530. The signal receiver 510 includes an antenna 512, a low noise amplifier (LNA) 514, a mixer 516, amplifiers 518 and 522, analog baseband filter 520 and ADC 524.

An analog data signal is received by the antenna 512 and fed to the LNA 514, which amplifies the signal and forwards to a mixer 516. The data signal is shifted in frequency by the mixer 516, resulting in a mixed analog signal. The mixed signal is amplified using the amplifier 518, followed by filtering using the analog baseband filter 520, which removes unwanted frequencies from the mixed signal. The filtered signal is further amplified using the amplifier 522. The analog signal is then converted into digital form by the ADC 524, and then fed to the notch filter 530.

The notch filter 530 filters the digital data signal to cancel a spur component from the received signal. In some implementations, the notch filter 530 may be an example of a linear time-varying notch filter, such as the LTV notch filter 100. In such implementations, the frequency response of the notch filter 530 is varied dynamically by varying the filter coefficients linearly in discrete time steps. In some other implementations, the notch filter 530 may be a non-linear time-varying notch filter.

As described previously, the notch filter 530 measures one or more of the characteristics of the digital input signal (e.g., the signal power level, spur frequency and packet type), and selects a set of coefficient values based on the measured characteristics, based on which the values of the filter coefficients are updated in discrete time steps, e.g., every clock cycle. In some implementations, the notch filter 530 bypasses the filtering operation if the measured power level (e.g., RSSI) of the input signal is greater than a threshold.

By dynamically varying the frequency response and selectively attenuating the input data signal, the notch filter 530 removes most of the spur power from the received signal while minimizing the effect of the filtering on the useful data portion of the signal. Consequently, the sensitivity of the received signal can be greatly improved, compared to the case where the notch filter 530 is not used.

The improvement in the sensitivity of the data signal upon using the LTV notch filter 530 is indicated by TABLE 1, which shows the sensitivity of a Bluetooth signal (in dBm) for varying packet types and different spur power levels, where the spur lasts for 5 time slots (DH5). The first row of numerical values in TABLE 1 shows the signal sensitivity for a Bluetooth signal without any spur or filtering.

The second row of numerical values in TABLE 1 indicates the signal sensitivity for the same Bluetooth signal in the presence of a spur, but without any filtering by the LTV notch filter 530. The third row numerical values in TABLE 1 indicates the signal sensitivity for the Bluetooth signal with the spur after the signal is filtered by the LTV notch filter 530 to remove the spur.

TABLE 1

Signal Sensitivity Using Linear Time-Varying (LTV) Notch Filter

| Scenario/ Spur Power | Sensitivity degradation (in dB) for −82 dBm spur (BDR/BLE/ EDR2/EDR3) | Sensitivity degradation (in dB) for −86 dBm spur (BDR/BLE/ EDR2/EDR3) | Sensitivity degradation (in dB) for −90 dBm spur (BDR/BLE/ EDR2/EDR3) |
|---|---|---|---|
| No Notch, With Spur | 20/22/21/23 | 17/20/18/19 | 12/14/14/16 |
| Dynamic Notch, With Spur | 1/8/1/9 | 1/5/0/6 | 1/5/0/6 |

As can be seen, by performing spur cancellation using the LTV notch filter 530, a significant improvement in the sensitivity of the data signal may be achieved. In some cases, the improvement in sensitivity approaches the sensitivity level of the signal in the complete absence of the spur. For example, for a Bluetooth BDR data packet in the presence of a −82 dBm spur (first values in the first column of numerical values in TABLE 1), the signal sensitivity is −94 dBm when there is no spur and no filtering. In the presence of the spur, the sensitivity degradation is 20 dBm without any filtering. However, upon spur cancellation using the LTV notch filter 530, the sensitivity degradation is 1 dBm for a similar data packet, which is close to the sensitivity of the signal in the absence of the spur.

The improvement in the sensitivity of the data signal that may be achieved by using the LTV notch filter 530, in comparison to a traditional LTI notch filter, is indicated by a comparison of TABLE 1 with TABLE 2 below, which shows the sensitivity of a similar Bluetooth signal (in dBm) when an LTI notch filter is used instead of the LTV notch filter 530.

The control parameters for TABLE 2—packet types, spur power levels and spur duration—are same as in TABLE 1. The first and second row of numerical values in TABLE 2 show the signal sensitivity for a Bluetooth signal (i) without any spur or filtering, and (ii) in the presence of a spur, but without any filtering, respectively, which is similar to the corresponding columns of TABLE 1.

The third through the seventh rows of numerical values in TABLE 2 indicate the signal sensitivity for the Bluetooth signal with the spur after the signal is filtered by LTI notch filters of varying notch depths.

As can be seen, to achieve the level of signal sensitivity that may be obtained using the LTV notch filter 530, when using a LTI notch filter, the depth of the notch has to be high. However, even in such cases, the sensitivity of the signal may not be achieved for some packet types.

For example, for a Bluetooth BDR data packet in the presence of a −82 dBm spur (first values in the first column of numerical values in TABLE 2) and no notch filter the sensitivity is degraded by 20 dB. An LTI notch filter with a 35 dB deep notch is needed to achieve a signal sensitivity degradation of 2 dB, which is close to the original sensitivity and sensitivity achieved using the LTV notch filter 530.

However, when the LTI notch filter with 35 dB notch is used for a Bluetooth EDR3 packet, signal sensitivity cannot be achieved (which is indicated by "floor" in TABLE 2). In contrast, the LTV notch filter 530 may recover a considerable portion of the signal sensitivity (−80 dB) for a similar signal profile, as shown in TABLE 1. In this context, "floor" indicates the bit error rate (BER) or packet error rate (PER) floor above the Bluetooth standard requirement, even for high receive signal strength.

TABLE 2

Signal Sensitivity Using Linear Time-Invariant (LTI) Notch Filter

| Scenario/ Spur Power | Sensitivity degradation in dB for −82 dBm spur (BDR/BLE/ EDR2/EDR3) | Sensitivity degradation in dB for −86 dBm spur (BDR/BLE/ EDR2/EDR3) | Sensitivity degradation in dB for −90 dBm spur (BDR/BLE/ EDR2/EDR3) |
|---|---|---|---|
| No Notch, With Spur | 20/22/21/23 | 17/20/18/19 | 12/14/14/16 |
| 30 dB Notch, With Spur | 8/17/8/Floor* | 3/10/2/Floor* | 1/10/1/Floor* |
| 35 dB Notch, With Spur | 2/14/3/Floor* | 2/10/2/Floor* | 2/9/1/Floor* |

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the operations described (such as a program encoded in a computer-readable medium, which can be a memory device, a storage device, a machine-readable storage substrate, or other physical, machine-readable medium, or a combination of one or more of them).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Other embodiments fall within the scope of the following claims.

What is claimed is:

1. An apparatus comprising:
a time-variant notch filter that includes (i) a notch depth, and (ii) a notch bandwidth centered on a notch frequency, wherein at least one of the notch depth or the notch bandwidth is based on a coefficient of the time-variant notch filter, wherein the time-variant notch filter includes a feedback section and a feedforward section, which are configured to have a delay associated with the feedback section that is different from a delay associated with the feedforward section; and
a controller configured to:
set at least one of the notch depth to a first depth or the notch bandwidth to a first bandwidth by setting a value of the coefficient to a first value during a ramp-up of the time-variant notch filter before a packet is received, and
set at least one of the notch depth to a second depth or the notch bandwidth to a second bandwidth by adjusting the value of the coefficient to a second value based on determining that the packet is received, wherein the second depth is distinct from the first depth, and wherein the second bandwidth is distinct from the first bandwidth.

2. The apparatus of claim 1, wherein the controller comprises:
a processor; and
a non-transitory medium encoding instructions that are configured to instruct the processor to perform operations.

3. The apparatus of claim 1, wherein the controller is configured to set the notch depth, and the first depth is greater than the second depth.

4. The apparatus of claim 3, wherein the controller is configured to set the notch bandwidth, and the first bandwidth is greater than the second bandwidth.

5. The apparatus of claim 1, wherein the value of the coefficient is varied in linear steps.

6. The apparatus of claim 1, wherein the value of the coefficient at a time instant is based on one or more of a center frequency of the time-variant notch filter, a sampling frequency of a signal that includes the packet, a constant controlling a rate of change of the notch bandwidth, and an initial value of the coefficient.

7. The apparatus of claim 6, comprising a register, wherein the initial value of the coefficient is pre-programmed into the register.

8. The apparatus of claim 6, wherein the value of the coefficient is adjusted based on an estimated power of the packet, with the initial value of the coefficient set such that the time-variant notch filter is bypassed when the estimated power of the packet is greater than a predetermined threshold.

9. The apparatus of claim 8, comprising an analog-to-digital converter (ADC), wherein the estimated power of the packet includes power due to a harmonic of a clock signal, and wherein the harmonic is determined using the ADC.

10. The apparatus of claim 1, wherein the packet is a Bluetooth packet, and wherein the controller is configured to:
measure a power associated with the packet;
determine whether a sync word portion of the packet is received based on the measured power associated with the packet; and
set the notch depth to a third depth by adjusting the value of the coefficient to a third value, in response to a determination that the sync word portion of the packet is received.

11. The apparatus of claim 10, wherein the controller is configured to measure the power associated with the packet by measuring a Received Signal Strength Indicator (RSSI) associated with the packet.

12. The apparatus of claim 10, wherein the third depth is less than the first depth.

13. The apparatus of claim 1, wherein the time-variant notch filter is configured to process the packet using the feedforward section prior to processing the packet using the feedback section.

14. The apparatus of claim 1, wherein at least one of the first value or the second value is stored in a lookup table associated with the time-variant notch filter, and wherein the controller is configured to:
   read at least one of the first value or the second value from the lookup table; and
   adjust the value of the coefficient based on reading at least one of the first value or the second value from the lookup table.

15. The apparatus of claim 1, wherein the controller is configured to set the notch depth to one of a plurality of depths by adjusting the value of the coefficient to one of a plurality of values.

16. The apparatus of claim 1, wherein the time-variant notch filter includes a plurality of notch depths and notch bandwidths centered on varying notch frequencies that are based on one or more coefficients of the time-variant notch filter, and wherein the controller is configured to set one or more of the plurality of notch depths and notch bandwidths to respective depths and bandwidths by setting values of associated coefficients.

17. A method comprising:
   receiving, at a filtering device, a communications signal;
   determining, by the filtering device, one or more parameters of the communications signal;
   selecting, by the filtering device, a set of filter coefficient values based on the determined one or more parameters of the communications signal;
   adjusting one or more characteristics of the filtering device using the selected set of filter coefficient values to set a frequency response of the filtering device to a first frequency response, wherein the filtering device includes a feedback section and a feedforward section, which are configured to have a delay associated with the feedback section that is different from a delay associated with the feedforward section;
   filtering, by the filtering device, the communications signal using the first frequency response of the filtering device, wherein the filtering is performed at a first time before packet data included in the communications signal is received;
   updating the set of filter coefficient values at a second time based on determining that the packet data included in the communications signal is received; and
   adjusting one or more characteristics of the filtering device using the updated set of filter coefficient values to set the frequency response of the filtering device to a second frequency response.

18. The method of claim 17, wherein determining one or more parameters of the communications signal comprises:
   determining, by the filtering device, at least one of a power level of the communications signal, a packet type of the packet data included in the communications signal, or a frequency of an external signal harmonic that is causing interference with the communications signal.

19. The method of claim 17, wherein the filtering device is a notch filter, and wherein configuring one or more characteristics of the filtering device comprises:
   configuring at least one of a notch depth or a notch bandwidth of the filtering device based on the determined one or more parameters of the communications signal.

20. The method of claim 19, wherein configuring at least one of a notch depth or a notch bandwidth of the filtering device comprises:
   setting the notch depth and the notch bandwidth to first values at a first time instant; and
   updating values of the notch depth and the notch bandwidth in successive time instants following a linear curve, wherein updated values of the notch depth and the notch bandwidth are based on the selected set of filter coefficient values.

21. The method of claim 19, comprising:
   determining, by the filtering device and upon examining the received communications signal, whether end of packet header is reached;
   based on determining that the end of the packet header is reached, measuring, by the filtering device, a power level of the communications signal;
   comparing, by the filtering device, the measured power level with a predetermined threshold value; and
   based on determining that the measured power level is greater than the predetermined threshold value, setting the filter coefficient values to predetermined values.

22. The method of claim 21, wherein the power level of the communications signal includes received signal strength indicator (RSSI).

23. The method of claim 21, wherein the predetermined values of the filter coefficients are lower than other filter coefficient values, and wherein the method comprises:
   updating values of the notch depth and the notch bandwidth based on the predetermined values of the filter coefficients, wherein the updated values of the notch depth and the notch bandwidth are lower than previous values of the notch depth and the notch bandwidth.

24. The apparatus of claim 1, wherein the value of the coefficient is set to the first value based on an estimated power of the packet.

25. The method of claim 17, wherein selecting the set of filter coefficient values based on the determined one or more parameters of the communications signal comprises:
   estimating a power level of the communications signal; and
   adjusting the set of filter coefficient values based on the estimated power level of the communications signal.

* * * * *